United States Patent
Shimazu et al.

(10) Patent No.: US 9,150,447 B2
(45) Date of Patent: *Oct. 6, 2015

(54) SILICA CRUCIBLE FOR PULLING SILICON SINGLE CRYSTAL AND METHOD OF PRODUCING THE SAME

(75) Inventors: Atsushi Shimazu, Akita (JP); Tadahiro Sato, Akita (JP)

(73) Assignee: JAPAN SUPER QUARTZ CORPORATION, Akita (JP)

( * ) Notice: Subject to any disclaimer, the term of this patent is extended or adjusted under 35 U.S.C. 154(b) by 1085 days.

This patent is subject to a terminal disclaimer.

(21) Appl. No.: 12/919,732

(22) PCT Filed: Mar. 2, 2009

(86) PCT No.: PCT/JP2009/053886
§ 371 (c)(1),
(2), (4) Date: Aug. 26, 2010

(87) PCT Pub. No.: WO2009/107834
PCT Pub. Date: Sep. 3, 2009

(65) Prior Publication Data
US 2011/0011334 A1    Jan. 20, 2011

(30) Foreign Application Priority Data
Feb. 29, 2008    (JP) .................................. 2008-049920

(51) Int. Cl.
*C30B 35/00*    (2006.01)
*C03B 19/09*    (2006.01)
(Continued)

(52) U.S. Cl.
CPC .............. *C03B 19/095* (2013.01); *C30B 15/10* (2013.01); *C30B 35/002* (2013.01); *C03C 15/00* (2013.01); *Y10T 117/1032* (2015.01)

(58) Field of Classification Search
CPC .... C30B 15/10; C30B 35/002; C30B 11/002; C03C 15/00
USPC ............................ 117/208, 200, 213, 13, 900
See application file for complete search history.

(56) References Cited

U.S. PATENT DOCUMENTS 6,136,092 A     10/2000   Sato et al.
6,150,006 A *   11/2000   Hellmann et al. ............ 428/141
(Continued)

FOREIGN PATENT DOCUMENTS

JP    03-037184 A    2/1991
JP    05-024969 A    2/1993
(Continued)

OTHER PUBLICATIONS

Taiwan Office action, mail date is Jun. 4, 2012.
(Continued)

*Primary Examiner* — Matthew Song
(74) *Attorney, Agent, or Firm* — Pearne & Gordon LLP

(57) ABSTRACT

There is provided a silica crucible for pulling a silicon single crystal, comprising silica glass and having a two-layer structure of an outer layer and an inner layer, wherein the inner layer, in a sectional side view of the crucible, has a wavy inner surface shape having mountain parts and valley parts at least between a start position and an end position for the pulling of a silicon single crystal in a silicon melt surface, and when a distance from an upper opening end of the crucible to the start position for the pulling of the silicon single crystal is 100, only a crucible portion from the upper opening end to a position within a range of 40 to 100 is crystalline.

5 Claims, 6 Drawing Sheets

(51) Int. Cl.
*C30B 15/10* (2006.01)
*C03C 15/00* (2006.01)

(56) References Cited

U.S. PATENT DOCUMENTS

| | | |
|---|---|---|
| 6,280,522 B1 | 8/2001 | Watanabe et al. |
| 6,548,131 B1 * | 4/2003 | Fabian et al. ............... 428/34.4 |
| 8,888,915 B2 * | 11/2014 | Sato ............................. 117/213 |
| 2004/0187771 A1 * | 9/2004 | Tsuji et al. .................... 117/220 |
| 2004/0237588 A1 * | 12/2004 | Schwertfeger et al. ........ 65/17.3 |
| 2005/0178319 A1 * | 8/2005 | Korus et al. .................. 117/200 |
| 2008/0141929 A1 * | 6/2008 | Kemmochi et al. ........... 117/208 |

FOREIGN PATENT DOCUMENTS

| | | |
|---|---|---|
| JP | 06-092779 A | 4/1994 |
| JP | 06-279167 A | 10/1994 |
| JP | 11-171687 A | 6/1999 |
| JP | 2000-169287 A | 6/2000 |
| JP | 2005-255488 A | 9/2005 |
| JP | 2006-124235 A | 5/2006 |
| JP | 2006-213556 A | 8/2006 |

OTHER PUBLICATIONS

International Search Report for PCT/JP2009/053886; mail date Jun. 2, 2009.

* cited by examiner

FIG. 2
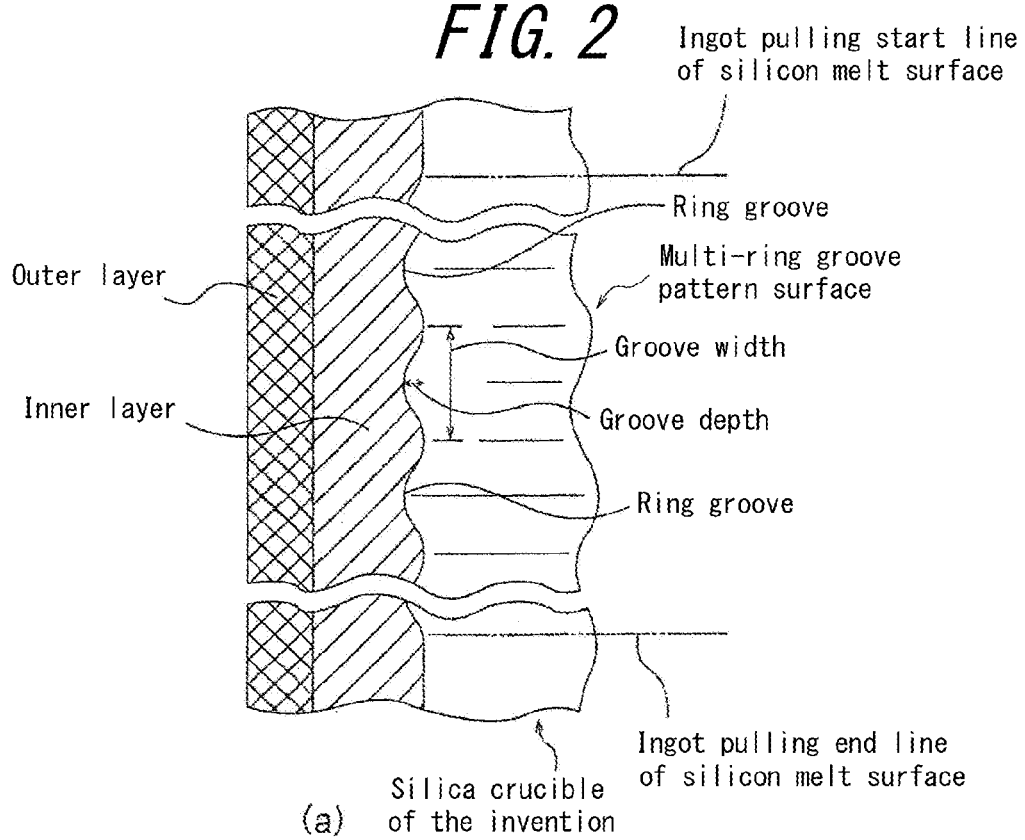
(a)
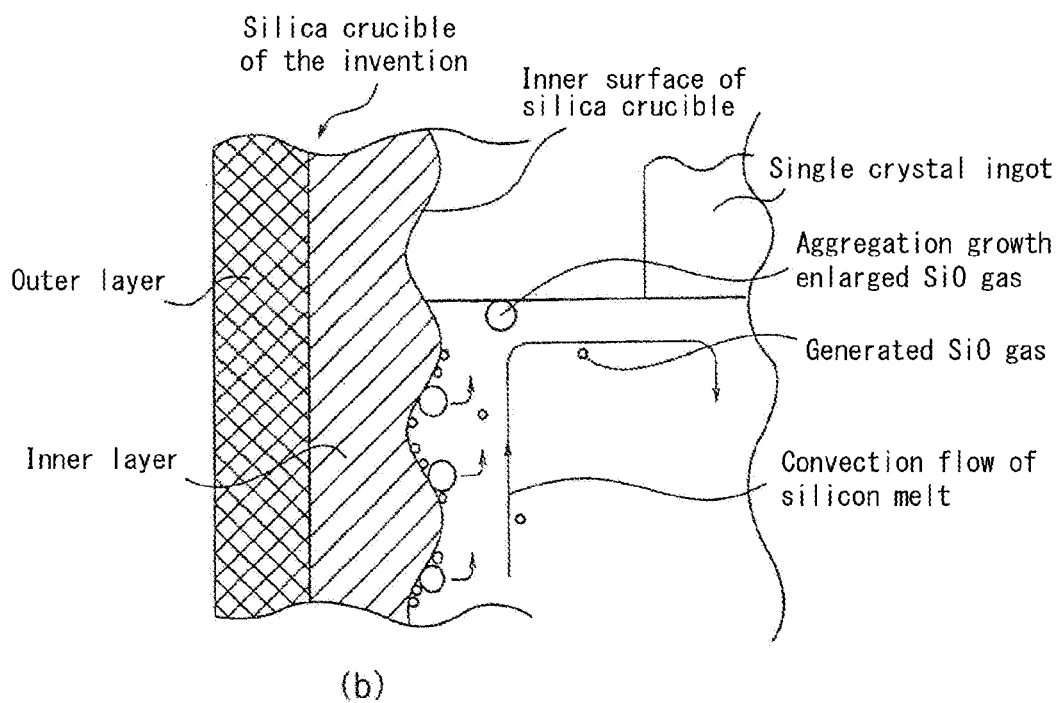
(b)

FIG. 4
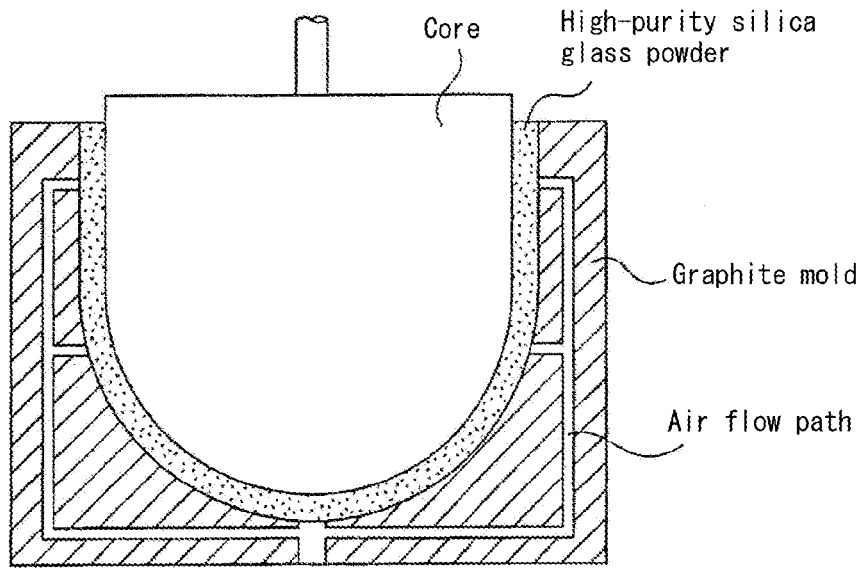
(a)
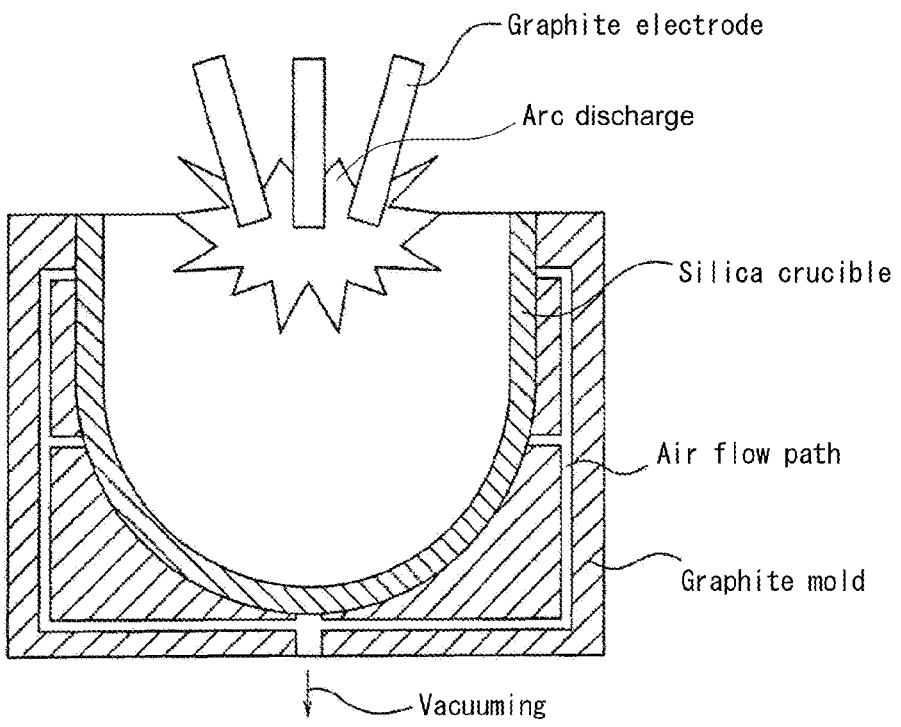
(b)

SILICA CRUCIBLE FOR PULLING SILICON SINGLE CRYSTAL AND METHOD OF PRODUCING THE SAME

TECHNICAL FIELD

This invention relates to a high-purity silica glass crucible used for pulling a silicon single crystal ingot for a semiconductor, and more particularly to a high-purity silica glass crucible (hereinafter referred to as a silica crucible simply) with a high strength capable of reducing SiO gas taken from a silicon melt into a large-diameter silicon single crystal ingot (hereinafter referred to as a single crystal ingot simply) during pulling to significantly reduce pinhole defects in the single crystal ingot due to the SiO gas and prevent the occurrence of deformation, distortion and the like.

BACKGROUND ART

Heretofore, as typically illustrated by schematic vertical sectional views in FIGS. 4(a) and (b), it is known that high-purity silica glass powder having an average particle size of 200-300 μm and a purity of not lower than 99.99% is used as a starting material and filled into a space defined by an inner surface of a graphite mold and an outer surface of a core, for example, a space of 30 mm while rotating the graphite mold at a speed of 60-80 rpm [see FIG. 4(a)], and then the core is taken out after the filling, and a three-phase AC arc discharge apparatus using graphite electrodes is inserted from an upper opening part while rotating the graphite mold at a speed of 50-100 rpm and reciprocated vertically along the inner surface of the graphite mold to heat an inside of the graphite mold to a temperature of about 2000° C., while the starting powder is melted and solidified while conducting vacuuming through an air flow path opened to the inner surface of the graphite mold, whereby a silica crucible having, for example, a thickness of 10 mm is produced [see FIG. 4(b)].

Also, it is known that the resulting silica crucible has a two-layer laminated structure composed of an outer layer of high-purity amorphous silica glass having a bubble content (expressed by a percentage of a total volume of bubbles contained in silica glass per unit volume) of 1 to 10% and a purity of not lower than 99.99% and an inner layer of high-purity amorphous silica glass having a bubble content of not higher than 0.6% and a purity of not lower than 99.99% and a thickness ratio of the inner layer to the outer layer is commonly adjusted so as to be 1:1-5 [see FIG. 6].

Furthermore, as shown by a schematic vertical sectional view in FIG. 5, it is well known that the single crystal ingot is produced by charging a high-purity polycrystalline silicon lump into a silica crucible mounted onto a graphite support, melting the polycrystalline silicon lump by a heater disposed along an outer periphery of the graphite support to form a silicon melt, and heating and maintaining a temperature of the silicon melt to a given temperature range of 1500-1600° C. and bringing a silicon seed crystal into contact with the silicon melt surface while rotating the silica crucible and simultaneously rotating the silicon seed crystal in an Ar gas atmosphere under a reduced pressure to pull it.

Moreover, in the above production of the single crystal ingot, as also shown in FIG. 5, the silicon melt moves through convection flow of flowing downward in the silica crucible from the bottom of the single crystal ingot to the bottom of the crucible and then flowing upward along the inner surface of the crucible from the bottom thereof toward the bottom of the single crystal ingot, during which the silicon melt (Si) and the inner surface (SiO$_2$) of the crucible are reacted to generate SiO gas. The thus generated SiO gas moves toward the silicon melt surface together with the flow of the silicon melt and is released and removed into the Ar gas atmosphere under a reduced pressure, but it is incorporated into the single crystal ingot during the pulling to cause pinhole defect, so that the ingot is produced by adjusting the pulling conditions so as not to cause such a defect.

In addition, for the purpose of preventing deformation and distortion of the silica crucible during the pulling of the single crystal ingot to prolong the service life of the silica crucible, it is also attempted to improve the strength of the silica crucible by interposing a crystallization promoter made of an oxide, a hydroxide, a carbonate or the like of an alkali earth metal between the inner layer and the outer layer of the silica crucible, or by applying the crystallization promoter onto an upper opening portion of the crucible along an outer peripheral surface thereof to transform an amorphous structure into a crystalline structure by the action of the crystallization promoter during melt-molding.

Patent Document 1: JP-B-H07-42193
Patent Document 2: JP-A-2000-169287
Patent Document 3: JP-A-H11-171687
Patent Document 4: JP-A-2006-124235
Patent Document 5: JP-A-2005-255488

DISCLOSURE OF THE INVENTION

On the other hand, the demand for increasing a diameter of the single crystal ingot is strong recently, and hence there is a tendency of producing a large-diameter single crystal ingot with a diameter of 200 to 300 mm. As the diameter of the single crystal ingot becomes larger, the diameter of the silica crucible also becomes larger, so that it is required to use a silica crucible having an outer diameter of about 610-810 mm for pulling a large-diameter single crystal ingot with a diameter of 200-300 mm. In this case, as the diameter of the silica crucible becomes larger, a contact area between the silicon melt and the inner surface of the silica crucible during the pulling is enlarged to significantly increase the generation of SiO gas, and hence it is difficult to sufficiently release a large amount of the generated SiO gas into an Ar gas atmosphere under a reduced pressure, so that there is a problem that the gas moves to the bottom of the single crystal ingot, during pulling, together with the flow of the silicon melt and is incorporated into the ingot to frequently cause pinhole defects.

Also, it is unavoidable to use a silica crucible having a high-strength crystalline structure with the enlargement in the diameter of the silica crucible. In the conventional silica crucible having a high strength obtained by transforming an amorphous structure into a crystalline structure through the action of the crystallization promoter, however, the crystallization is far advanced even in the pulling by the action of the crystal accelerator existing in the crucible in combination with the lengthening of the pulling time based on the increase in the diameter of the single crystal ingot, and hence crystal grains are made further minute to more increase grain boundaries. And, the reaction between the silicon melt (Si) and the inner surface of the crucible (SiO$_2$) occurs more actively in the grain boundary than the amorphous (vitreous) structure, and hence the generation of SiO gas is also significantly increased, so that it is difficult to sufficiently release a large amount of the generated SiO gas into an Ar gas atmosphere under a reduced pressure. Therefore, there is a problem that the gas moves to the bottom of the single crystal ingot, during pulling, together with the flow of the silicon melt and is incorporated into the ingot to promote the occurrences of pinhole defects.

In order to accomplish the above-mentioned goal, the summary and construction of the invention are as follows:

(1) A silica crucible for pulling a silicon single crystal, comprising silica glass and having a two-layer structure of an outer layer and an inner layer, wherein the inner layer, in a sectional side view of the crucible, has a wavy inner surface shape having mountain parts and valley parts at least between a start position and an end position for the pulling of a silicon single crystal in a silicon melt surface, and when a distance from an upper opening end of the crucible to the start position for the pulling of the silicon single crystal is 100, only a crucible portion from the upper opening end to a position within a range of 40 to 100 is crystalline.

(2) A silica crucible for pulling a silicon single crystal according to the item (1), wherein the inner layer has such an inner surface shape that a distance between a top position of the mountain part and a deepest position of the valley part is 0.1 to 3 mm and a distance between tops of the mountain parts is 10 to 100 mm.

(3) A silica crucible for pulling a silicon single crystal according to the item (1) or (2), wherein when a height position of the bottom of the crucible is 0 and a height position of the upper opening end of the crucible is 100 in a sectional side view of the crucible, the start position for the pulling of the silicon single crystal is within a height position range of 50 to 95 from the bottom of the crucible and the end position for the pulling of the silicon single crystal is within a height position range of 0 to 10 from the bottom of the crucible.

(4) A method of producing a silica crucible for pulling a silicon single crystal according to the item (1), (2) or (3), wherein a crystalline structure of a crystalline portion of the crucible is formed by melt-molding the silica crucible at a state provided with a ring-shaped cutoff portion containing 0.01-1 mass % of a crystallization promoter and extending upward from an upper opening end of the crucible.

In the melt-molding of the silica crucible according to the invention, the ratio of the crystallization promoter compounded in the ring-shaped cutoff portion is set to be 0.01 to 1 mass %. If the ratio is less than 0.01 mass %, when a distance from the upper opening end of the crucible to the start position for the pulling of the silicon single crystal is 100, it is not possible to crystalline only a crucible portion from the upper opening end to a position within a range of 40 to 100. Therefore, the desired high strength cannot be secured in the main body of the silica crucible, and hence the deformation, distortion and the like are caused due to a deficiency of the strength in a large-diameter silica crucible having an inner diameter of 610-810 mm. While, if the ratio exceeds 1 mass %, crystallization proceeds, over an ingot-pulling start line of the silicon melt surface, toward the inner portion of the crucible and the crystalline structure in a zone contacting with the silicon melt is also made crystalline, and hence the generation of SiO gas at the crystal grain boundary as mentioned above is activated in this zone to facilitate the occurrence of pinhole defects in the single crystal ingot.

According to the silica crucible of the invention, even if the size of the crucible is increased to an outer diameter of 610-810 mm for pulling a large-diameter single crystal ingot of 200 to 300 mm in diameter, a large amount of SiO gas generated along with the increase of the crucible diameter through reaction between the inner surface of the crucible and the silicon melt is retained in the inner surface of the crucible constituting the wavy inner surface shape with mountain parts and valley parts. The retained SiO gas is retained until it is grown by aggregating with sequentially generated SiO gas to a size not affected by the convection flow of silicon melt. The above generated SiO gas is separated from the ring groove when the generated gas is grown to a size which has large buoyancy, moves straight toward the silicon melt surface at once, and is released into an Ar gas atmosphere under a reduced pressure. Therefore, the amount of the generated SiO gas moving with the convection flow of silicon melt to the bottom of the single crystal ingot during pulling is significantly reduced, and hence it is possible to considerably reduce the occurrence of pinhole defects in the single crystal ingot. Furthermore, when only a crucible portion ranging from the upper opening end to a position within a range of 40 to 100 is rendered to be crystalline, it is possible to secure the high strength capable of preventing the occurrence of deformation, distortion and the like in the silica crucible, but also the inner surface of the crucible substantially contacting with the silicon melt keeps amorphous structure during the pulling of the single crystal ingot since no crystallization promoter is existent in the silica crucible after molding, whereby the reaction between the inner surface of the crucible and the silicon melt is further suppressed as compared with the crystalline structure, and hence there is obtained a remarkable action capable of suppressing the occurrence of pinhole defects in the single crystal ingot due to the generated SiO gas.

BRIEF DESCRIPTION OF DRAWINGS

FIG. 2 is a schematic vertical sectional view of a main part showing the silica crucible according to the invention, in which (a) is a diagram showing a wavy inner surface shape having mountain parts and valley parts and (b) is a diagram schematically showing the behavior of SiO gas generated inside the silica crucible.

FIG. 4 is a schematic vertical sectional view showing production steps of a silica crucible, in which (a) is a diagram showing a state of filling a material powder and (b) is a diagram showing a state of melt-molding a silica crucible.

BEST MODE FOR CARRYING OUT THE INVENTION

The embodiments of the invention will be described with reference to the accompanying drawings below.

The silica crucible for the pulling of a single crystal according to the invention is a silica crucible for pulling a silicon single crystal comprising silica glass and having a two-layer structure of an outer layer and an inner layer, wherein the inner layer has a wavy inner surface shape having mountain parts and valley parts at least between a start position and an end position for the pulling of silicon single crystal in a silicon melt surface in a sectional side view of the crucible, and when a distance from an upper opening end of the crucible to the start position for the pulling of the silicon single crystal is 100, only a crucible portion from the upper opening end to a position within a range of 40 to 100 is crystalline.

Figure 6:
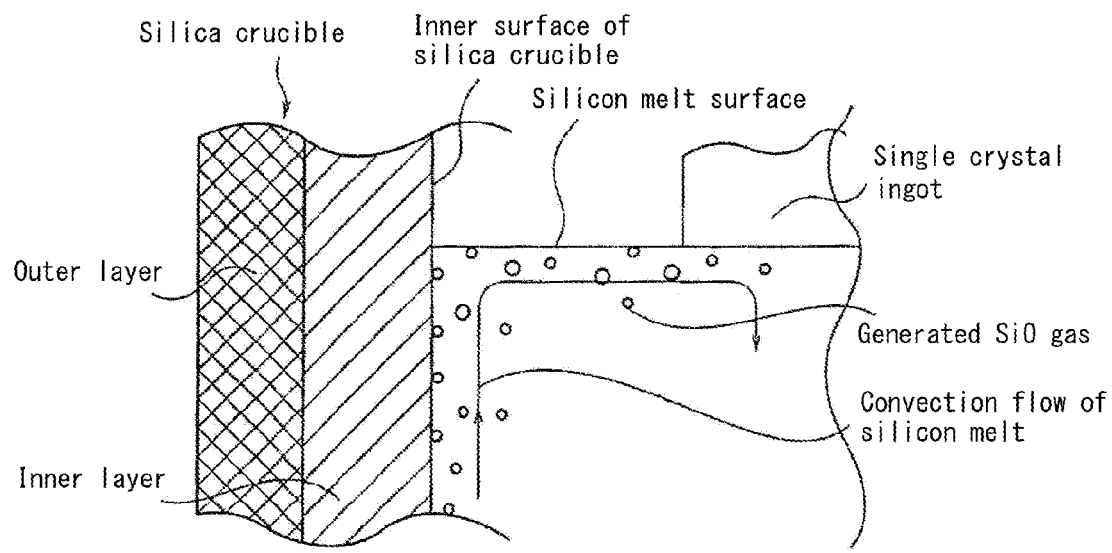
FIG. 6 is a diagram schematically showing the behavior of SiO gas generated in an inner surface of the conventional silica crucible.

In the conventional pulling, SiO gas generated by reaction between the silicon melt and the inner surface of the silica crucible has a size of 50-200 μm in diameter immediately after the generation and moves with convection flow of the silicon melt along the inner surface of the crucible. Most of the SiO gas is released from the silicon melt surface into an Ar gas atmosphere under a reduced pressure while maintaining the above size as schematically shown by the vertical sectional view of the main part in FIG. 6, but the remaining slight amount of the generated SiO gas moves to the bottom of the single crystal ingot during pulling and is incorporated thereinto, resulting in pinhole defects. Therefore, there is a problem that the ratio of SiO gas incorporated into the single crystal ingot is significantly increased as diameters of the ingot and the crucible become larger.

Figure 1:
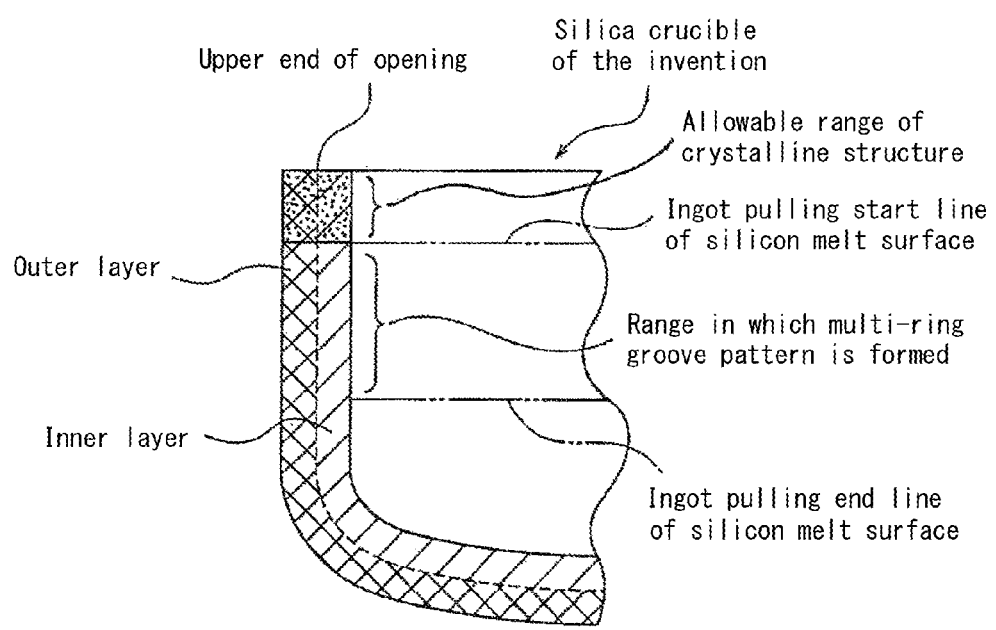
FIG. 1 is a schematic vertical sectional view showing a half portion of the silica crucible according to the invention.

On the contrary, as shown by the schematic vertical sectional views in FIGS. 1, 2(a) and 2(b), when at least an inner surface of the silica crucible between a start line and an end line for the pulling of an ingot in the silicon melt surface is rendered to be of "wavy inner surface shape having mountain parts and valley parts in the sectional side view of the silica crucible", an inside of a ring groove constituting the wavy inner surface shape is a retention zone being free of the influence by the flow of the silicon melt as schematically shown by the vertical sectional view of the main part in FIG. 2(b). Therefore, SiO gas generated at the bottom section of the crucible is moved along the inner surface of the crucible with the flow of the silicon melt to the inside of the wavy inner surface shape, where it is retained at a state attached to the inner surface of the ring groove together with SiO gas generated in the wavy inner surface shape and then grown by aggregating with SiO gas sequentially moving into the ring groove and SiO gas sequentially generated in the wavy inner surface shape. When the size is enlarged into about 500-900 μm, the accumulated gas has a large buoyancy and it separates from the wavy inner surface shape and rises straight toward the silicon melt surface by its large buoyancy without being affected by the convection flow of silicon melt. Thus, it is released into an Ar gas atmosphere under a reduced pressure. Therefore, it is possible to significantly reduce SiO gas caught by the convection flow of silicon melt and moved to the bottom of the single crystal ingot during pulling and incorporated thereinto to cause pinhole defects. This phenomenon is not changed even if the diameters of the single crystal ingot and the silica crucible are increased.

Here, it is preferable that the start position for the pulling of the silicon single crystal shown in FIG. 2(a) means a height position range of 50-95 when a height position of the bottom of the silica crucible is 0 and a height position of the upper opening end is 100 in the sectional side view of the silica crucible, and the end position for the pulling of the silicon single crystal means a height position range of 0-10 when the height position of the bottom of the silica crucible is 0 and the height position of the upper opening end is 100. If the start position for the pulling of the silicon single crystal is above 95 when the height position of the bottom of the silica crucible is 0 and the height position of the upper opening end is 100, the wavy shape is existent just proximal to the upper opening end, so that the sufficient strength of the crucible cannot be obtained and there is a fear of causing deformation or distortion of the silica crucible, while if it is positioned below 50, SiO gas cannot be suppressed sufficiently. Moreover, the reason why the lower limit of the wavy inner surface shape is a position of 0-10 when the height position of the bottom of the silica crucible is 0 and the height position of the upper opening end is 100 is due to the fact that when the end position for the pulling of the single crystal is above 10, SiO gas cannot be suppressed sufficiently and there is a fear of causing pinhole defects.

Furthermore, it is preferable that the wavy inner surface shape is provided on a whole of a straight body section in the sectional side view of the crucible, for example, on an area ranging from a position of 5 mm to 10 mm below the upper opening end of the crucible as an upper end to a lower end of the straight body section of the silica crucible in the sectional side view of the crucible. When the upper end of the wavy inner surface shape is above 5 mm below the upper opening end of the crucible, the wavy shape is existent just proximal to the upper opening end, so that the sufficient strength of the crucible cannot be obtained and there is a fear of causing deformation or distortion of the silica crucible, while when it is positioned downward over 10 mm below the upper opening end of the crucible, SiO gas cannot be suppressed sufficiently and there is a fear of causing pinhole defects in the silicon single crystal ingot. Moreover, the reason why the lower end of the wavy inner surface shape is the same height position as the lower end of the straight body section of the silica crucible is due to the fact that since the end position for the pulling of the silicon single crystal in the silicon melt is frequently below the straight body section, if the end of the wavy inner surface shape is positioned above the straight body section, SiO gas cannot be sufficiently suppressed and there is a fear of causing pinhole defects, while when the wavy inner surface shape is positioned below the straight body section, the production of silica crucible becomes complicated though the effect of suppressing SiO gas is improved. The straight body section of the silica crucible means a body section of the silica crucible as the name suggests, and concretely indicates a crucible portion covering a range until the curvature is varied from the upper end to the bottom of the silica crucible.

When the pulling experiments of a large-diameter single crystal ingot having a diameter of 200-300 mm are conducted using a large silica crucible with an inner diameter of 610-810 mm, it is preferable that the distance between the top position of the mountain part and the deepest position of the valley part is 0.1-3 mm and the distance between the tops of the mountain parts is 10-100 mm in that the occurrence of pinhole defects can be suppressed maximally in the above large-diameter single crystal ingot. In the silica crucible of the invention, the depth and width of the ring groove constituting the wavy inner surface shape with mountain parts and valley parts are defined based on the results of various experiments as mentioned above. When the depth and width of the ring groove fulfill the above numerical conditions (the distance between the top position of the mountain part and the deepest position of the valley part is 0.1-3 mm and the distance between the tops of the mountain parts is 10-100 mm), the occurrence of pinhole defects in the large-diameter single crystal ingot can be reduced sufficiently. On the other hand, when either of the depth and width of the ring groove is out of the above numerical range, there is a fear that the desired effect of reducing pinhole defects is not obtained.

FIGS. 2(a) and (b) illustrate a case that the wave form of the inner surface shape in the cross section of the silica crucible is "sine wave". However, even if such a wave form is modified, the same significant effect is also obtained as long as the distance between the top position of the mountain part and the deepest position of the valley part and the distance between the tops of the mountain parts are within the above ranges, respectively.

Moreover, when the distance from the upper opening end of the crucible to the start position for the pulling of the silicon single crystal is 100, only a crucible portion from the upper opening end to a position within a range of 40 to 100 is rendered to be crystalline. Since the strength of the silica crucible during the pulling of a single crystal ingot is determined by the strength of the upper opening end portion of the crucible, as long as the high strength can be secured in only the upper opening end portion of the crucible, even if only the upper opening end portion of the crucible is composed of a high-strength crystalline structure and the other portions (substantially below the start line of the silicon melt surface for the pulling of the ingot) are composed of an amorphous structure, the silica crucible can maintain the high strength even in the pulling of the single crystal ingot, and hence it is made possible to prevent deformation or distortion of the silica crucible.

On the other hand, as seen in the conventional silica crucible, when the silica crucible is put into practical use (for pulling a single crystal ingot) at a state that the crystallization promoter is existent in the silica crucible, further crystallization of the silica crucible is developed through the action of the crystallization promoter during the pulling of the single crystal ingot to miniaturize the crystal, and as a result, the crystal grain boundary is increased to actively cause the reaction of $Si+SiO_2$ in the crystal grain boundary to thereby promote the occurrence of pinhole defects in the single crystal ingot during pulling. However, when the crystallization promoter is not existent in the silica crucible, it is possible to prevent the crystallization development action (grain boundary increasing action) in the silica crucible during pulling.

Figure 3:
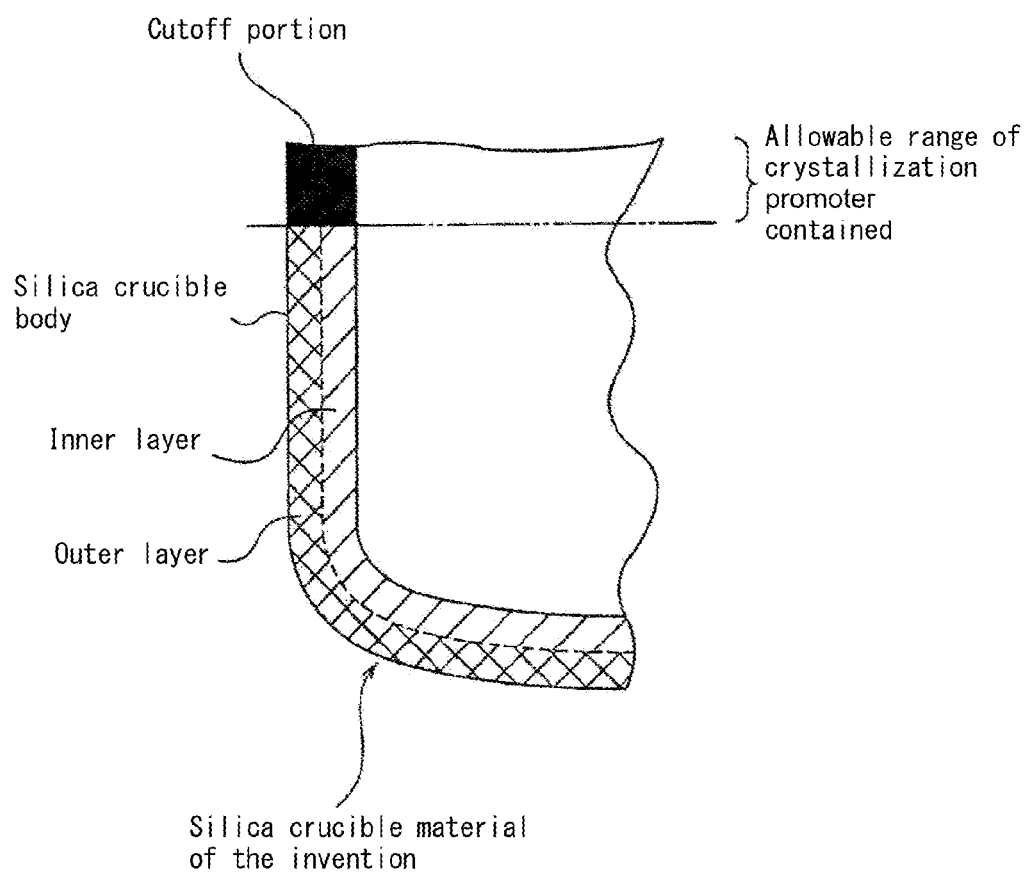
FIG. 3 is a schematic vertical sectional view showing a half portion of silica crucible materials according to the invention.

The method of producing a silica crucible for the pulling of a single crystal according to the invention is characterized in that, as shown in the schematic vertical sectional view of a half portion of silica crucible materials according to the invention in FIG. 3, a crystalline structure of the crystalline crucible portion is formed by melt-molding silica crucible materials at a state provided with a ring-shaped cutoff portion containing 0.01-1 mass % of a crystallization promoter (preferably at least one of aluminum oxide (hereinafter indicated by $Al_2O_3$), calcium oxide (hereinafter indicated by CaO), barium oxide (hereinafter indicated by BaO), calcium carbonate (hereinafter indicated by $CaCO_3$) and barium carbonate (hereinafter indicated by $BaCO_3$)) and extending upward from the upper opening end of the crucible. As shown in the silica crucible of the invention in FIG. 1, a part of the silica crucible is made crystalline by the action of the crystallization promoter, so that when a distance from the upper opening end of the silica crucible to the start position for the pulling of the silicon single crystal is 100, a portion from the upper opening end to a range of 40-100 can be made crystalline by adjusting a compounding ratio of the crystallization promoter. In this case, a high-strength silica crucible having no occurrence of deformation, distortion and the like in the pulling of the single crystal ingot is obtained even if the inner diameter of the silica crucible is as large as 610-810 mm.

Furthermore, when the ring-shaped cutoff portion containing the crystallization promoter is removed after the melt-molding of the silica crucible materials, the crystallization promoter is not existent in the resulting main body of the silica crucible. Therefore, further crystallization does not occur on an amorphous portion (the remaining portion resulted by removing the crystallized portion between the upper opening end of the main body of the silica crucible and the start line for the pulling of the ingot in the silicon melt surface) during the pulling of the single crystal ingot, and thus the amorphous portions remains amorphous. Therefore, the generation of SiO gas is significantly suppressed as compared with the crystalline structure, and hence the occurrence of pinhole defects can be suppressed in the single crystal ingot.

This phenomenon is same even in the large-diameter single crystal ingot having a diameter of 200-300 mm.

EXAMPLE (A) According to the production process shown in FIGS. 4(a) and 4(b), high-purity silica glass powder with a purity of 99.998 mass % having an average particle size of 250 μm is used as a starting powder for the purpose of forming a main body of a crucible under normal conditions, which is filled into a space of 30 mm defined between an inner surface of a graphite mold and an outer surface of a core while the graphite mold and the core are rotated at a speed of 65 rpm. Then, a crystallization promoter is compounded and mixed with the starting powder at a ratio shown in Table 1 for the purpose of forming a ring-shaped cutoff portion extending upward from an upper opening end of the crucible main body at a height (width) of 20 mm and integrated thereinto to form a mixed starting powder, which is also filled. After the filling, the core is taken out and a three-phase AC arc discharge apparatus using graphite electrodes is inserted from the upper opening while rotating the graphite mold at a speed of 65 rpm and reciprocated up and down along the inner surface of the graphite mold to heat an inside of the graphite mold to a temperature of about 2000° C. On the other hand, the starting powder is melted and solidified in the graphite mold while conducting vacuuming through an air flow path opened to the inner surface of the mold to form silica crucible materials of the invention having a structure shown in FIG. 3 comprised of a crucible main body and a ring-shaped cutoff portion having a height (width) of 20 mm and containing the crystallization promoter. Subsequently, the ring-shaped cutoff portion is cut and removed from the silica crucible materials of the invention using a diamond cutter, and thereafter a wavy inner surface shape having mountain parts and valley parts, in which each of a depth and a width of a ring groove is shown in Table 1 and a vertical section inner surface shape is sine wave, is formed in the inner surface of the crucible between a start line for ingot pulling and an end line for ingot pulling in a silicon melt surface by grinding processing, and then the grinding-processed surface is subjected to a smooth finishing treatment using an oxy-fuel burner. Thus, there are prepared silica crucibles A-1 to A-9 according to the invention for the pulling of a single crystal ingot with a diameter of 200 mm, by 5 pieces respectively, each having such a size that an outer diameter is 610 mm, a depth is 380 mm and a thickness of 10 mm, and positioning a start line for ingot pulling in a silicon melt surface at 50 mm from an upper opening end of the crucible and an end line for pulling at 300 mm from the upper opening end, and having a two-layer laminated structure shown in FIG. 1 and composed of an inner layer of a high-purity silica glass with a bubble content of 0.3%, a purity of 99.998% and a thickness of 4 mm and an outer layer of a high-purity silica glass with a bubble content of 5%, a purity of 99.994% and a thickness of 6 mm, and containing no crystallization promoter in the upper end of the crucible.

(B) In the same production method as in the silica crucibles A-1 to A-9 of the invention in the above (A) except that the height (width) of the ring-shaped cutoff portion is 40 mm and the ratio of the crystallization promoter compounded therein is shown in Table 1 and the wavy inner surface shape having mountain parts and valley parts, in which each of a depth and a width of a ring groove is shown in Table 1 and a vertical section inner surface shape is sine wave, is formed in the inner surface of the crucible between a start line for ingot pulling and an end line for ingot pulling in a silicon melt surface by grinding processing, are prepared silica crucibles B-1 to B-9 according to the invention for the pulling of a single crystal ingot with a diameter of 300 mm, by 5 pieces respectively, each having such a size that an outer diameter is 810 mm, a depth is 435 mm and a thickness of 16 mm, and positioning a start line for ingot pulling in a silicon melt surface at 100 mm from the upper opening end and an end line for pulling at 335 mm from the upper opening end, and having a two-layer laminated structure composed of an inner layer of a high-purity silica glass with a bubble content of 0.2%, a purity of 99.998% and a thickness of 6 mm and an outer layer of a high-purity silica glass with a bubble content of 5%, a purity of 99.997% and a thickness of 10 mm, and containing no crystallization promoter in the upper end of the crucible.

COMPARATIVE EXAMPLE (C) According to the production process shown in FIGS. 4(a) and 4(b), high-purity silica glass powder with a purity of 99.998 mass % having an average particle size of 250 µm is used as a starting powder under normal conditions, which is filled into a space of 30 mm defined between an inner surface of a graphite mold and an outer surface of a core, up to a position lower by 20 mm from a final crucible size, while the graphite mold and the core are rotated at a speed of 65 rpm. Then, a crystallization promoter is compounded and mixed with the starting powder at a ratio shown in Table 2 to form a mixed starting powder, which is filled so as to render into the final crucible size. After the filling, the core is taken out and a three-phase AC arc discharge apparatus using graphite electrodes is inserted from the upper opening while rotating the graphite mold at a speed of 65 rpm and reciprocated up and down along the inner surface of the graphite mold to heat an inside of the graphite mold to a temperature of about 2000° C. On the other hand, the starting powder is melted and solidified in the graphite mold while conducting vacuuming through an air flow path opened to the inner surface of the mold to prepare conventional silica crucibles C-1 to C-10 for the pulling of a single crystal ingot with a diameter of 200 mm, by 5 pieces respectively, each having such a size that an outer diameter is 610 mm, a depth is 380 mm and a thickness of 10 mm, and positioning a start line for ingot pulling in a silicon melt surface at 50 mm from an upper opening end of the crucible and an end line for pulling at 300 mm from the upper opening end, and having a two-layer laminated structure composed of an inner layer of a high-purity silica glass with a bubble content of 0.3%, a purity of 99.998% and a thickness of 4 mm and an outer layer of a high-purity silica glass with a bubble content of 5%, a purity of 99.994% and a thickness of 6 mm, and containing crystallization promoter in the upper end of the crucible, provided that a wavy inner surface having mountain parts and valley parts is not formed in the inner surface of the crucible.

(D) In the same production method as in the conventional silica crucibles C-1 to C-9 in the above (C) except that the crystallization promoter is included in the upper opening end portion of the crucible to a position of 40 mm below the upper opening end are prepared conventional silica crucibles D-1 to D-9 for the pulling of a single crystal ingot with a diameter of 300 mm, by 5 pieces respectively, each having such a size that an outer diameter is 810 mm, a depth is 435 mm and a thickness of 16 mm, and positioning a start line for ingot pulling in a silicon melt surface at 100 mm from the upper opening end and an end line for pulling at 335 mm from the upper opening end, and having a two-layer laminated structure composed of an inner layer of a high-purity silica glass with a bubble content of 0.2%, a purity of 99.998% and a thickness of 6 mm and an outer layer of a high-purity silica glass with a bubble content of 5%, a purity of 99.997% and a thickness of 10 mm, and containing the crystallization promoter in the upper end of the crucible, provided that a wavy inner surface shape having mountain parts and valley parts is not formed in the inner surface of the crucible.

With respect to the resulting silica crucibles A-1 to A-9 and B-1 to B-9 according to the invention and conventional silica crucibles C-1 to C-9 and D-1 to D-9 are observed crystallization from the upper opening end of the crucible with an optical microscope, and a crystallization ratio when a distance from the upper opening end of the crucible to a start position for the pulling of a silicon single crystal is 100 is shown in Tables 1 and 2 (the column of "before ingot pulling") as an average value of 5 crucibles.

Figure 5:
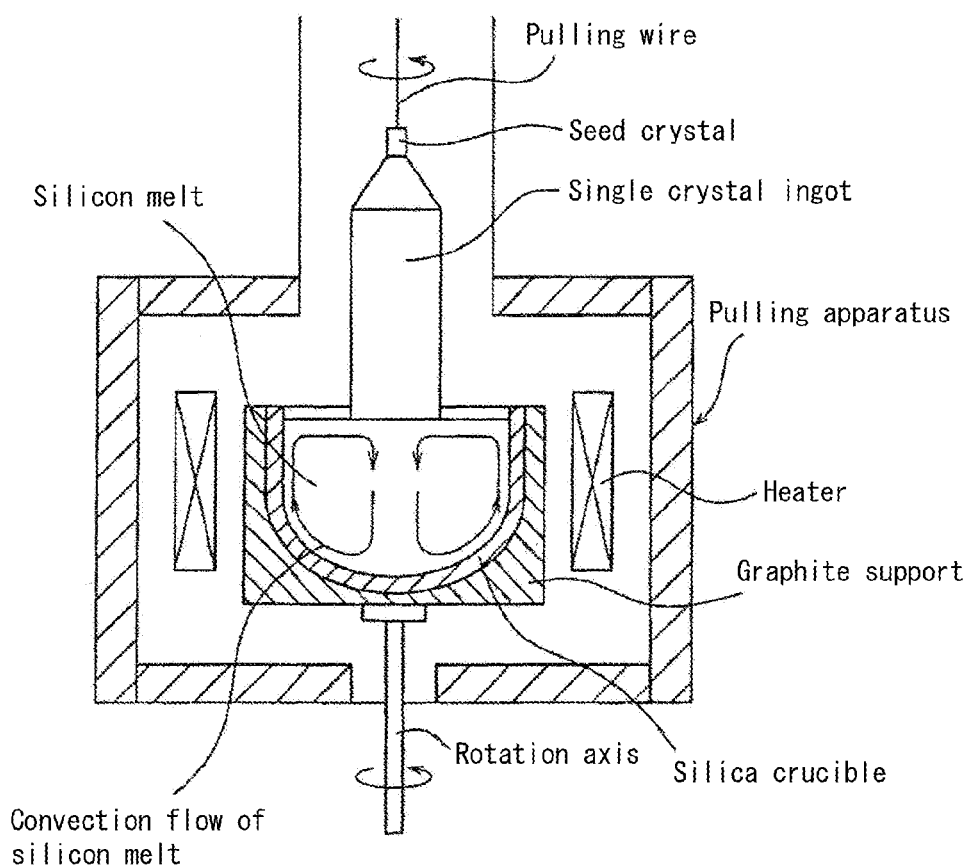
FIG. 5 is a schematic vertical sectional view showing a state of pulling a single crystal ingot.

Subsequently, single crystal ingots having diameters of 200 mm and 300 mm, respectively, are pulled up under normal conditions with a pulling apparatus shown in FIG. 5 using the silica crucibles A-1 to A-9 and B-1 to B-9 according to the invention and the conventional silica crucibles C-1 to C-9 and D-1 to D-9, which are prepared 5 pieces for each as described above. After the pulling of the single crystal ingots, the crystallization from the upper opening end of the crucible is observed with respect to the silica crucibles A-1 to A-9 and B-1 to B-9 according to the invention and the conventional silica crucibles C-1 to C-9 and D-1 to D-9 using an optical microscope, and a crystallization ratio when a distance from the upper opening end of the crucible to a start position for the pulling of a silicon single crystal is 100 is shown in Tables 1 and 2 (the column of "after ingot pulling") as an average value of 5 crucibles.

(Evaluation)
(1) Suppression of Pinhole Defects

As to the above various silica crucibles after the pulling of the single crystal ingot, an inner diameter in the upper opening end of the crucible is measured at 10 points along its inner periphery, and as a result, any crucibles are considerably small in the deformation because a difference between the maximum value and the minimum value is in a range of not larger than 1 mm. Furthermore, 5 single crystal ingots are produced in each one of the silica crucibles A-1 to A-9 and B-1 to B-9 according to the invention and the conventional silica crucibles C-1 to C-9 and D-1 to D-9. Also, 1000 wafers having a thickness of 725 µM are cut out from one single crystal ingot having a diameter of 200 mm and 800 wafers having a thickness of 775 µm are cut out from one single crystal ingot having a diameter of 300 mm. With respect to the total wafers cut out from 5 single crystal ingots, respectively, the upper and lower surfaces of the wafers are inspected using an inspection apparatus to measure the number of wafers with pinhole defects when a wafer having a depression with a diameter of not smaller than 30 µm is regarded as a pinhole generating wafer. The measured results are shown in Tables 1 and 2.

(2) Strength of Silica Crucible

As to the strength of the silica crucible, a ruler is applied on the outer surface of the straight body section extending in a vertical direction of the silica crucible used after the pulling to measure, with a vernier caliper, a gap (mm) between the outer surface of the upper opening end and the ruler. An average value of 4 points measured in the outer periphery of the crucible is calculated as a deformation amount of the upper opening end portion (mm), whereby the strength of the silica crucible is evaluated.

TABLE 1

| | Type | Ratio of crystallization promoter compounded in cutoff portion (mass %) | Size of ring groove (mm) Groove depth | Size of ring groove (mm) Groove width | Crystallization ratio from upper opening end of crucible (volume %) Before ingot pulling | Crystallization ratio from upper opening end of crucible (volume %) After ingot pulling | Number of wafers with pinhole defects | Deformation amount of upper opening end portion (mm) |
|---|---|---|---|---|---|---|---|---|
| Silicon crucible of the invention | A-1 | Al$_2$O$_3$:1% | 0.5 | 10 | 98.1 | 99.0 | 7 | 0.9 |
| | A-2 | CaO:0.5% | 1 | 40 | 84.6 | 85.5 | 5 | 1.2 |
| | A-3 | BaO:0.1% | 1.5 | 70 | 74.8 | 75.8 | 4 | 1.4 |
| | A-4 | CaCO$_3$:0.05% | 2 | 100 | 63.9 | 64.8 | 6 | 1.6 |
| | A-5 | BaCO$_3$:0.01% | 1 | 20 | 42.6 | 42.9 | 6 | 4.1 |
| | A-6 | Al$_2$O$_3$:0.3% CaO:0.3% | 1 | 30 | 93.6 | 94.5 | 5 | 0.7 |
| | A-7 | CaO:0.01% BaCO$_3$:0.01% | 1 | 60 | 51.3 | 52.2 | 2 | 2.8 |
| | A-8 | BaO:0.06% CaCO$_3$:0.04% | 1 | 90 | 72.0 | 72.8 | 6 | 1.7 |
| | A-9 | Al$_2$O$_3$:0.1% BaO:0.2% CaCO$_3$:0.3% | 1 | 50 | 95.9 | 96.4 | 4 | 1.0 |
| | B-1 | Al$_2$O$_3$:0.5% BaO:0.5% | 2 | 50 | 98.9 | 99.6 | 7 | 0.8 |
| | B-2 | CaO:0.01% | 0.5 | 50 | 40.6 | 40.8 | 6 | 4.7 |
| | B-3 | BaCO$_3$:0.1% CaCO$_3$:0.1% | 1.5 | 50 | 77.4 | 78.2 | 5 | 1.2 |
| | B-4 | Al$_2$O$_3$:0.05% CaO:0.05% CaCO$_3$:0.05% | 1 | 50 | 76.5 | 77.3 | 4 | 1.2 |
| | B-5 | BaCO$_3$:0.8% | 1 | 10 | 94.0 | 94.5 | 6 | 0.7 |
| | B-6 | Al$_2$O$_3$:0.1% | 1 | 30 | 72.0 | 72.8 | 5 | 1.6 |
| | B-7 | CaO:0.35% BaCO$_3$:0.15% | 1 | 60 | 85.9 | 86.4 | 4 | 1.1 |
| | B-8 | BaO:1% | 1 | 80 | 98.1 | 99.0 | 8 | 0.9 |
| | B-9 | CaCO$_3$:0.5% | 1 | 100 | 84.0 | 84.4 | 6 | 1.2 |

TABLE 2

| | Type | Ratio of crystallization promoter compounded in upper opening end portion (mass %) | Size of ring groove (mm) Groove depth | Size of ring groove (mm) Groove width | Crystallization ratio from upper opening end of crucible (volume %) Before ingot pulling | Crystallization ratio from upper opening end of crucible (volume %) After ingot pulling | Number of wafers with pinhole defects | Deformation amount of upper opening end portion (mm) |
|---|---|---|---|---|---|---|---|---|
| Conventional silica crucible | C-1 | Al$_2$O$_3$:1% | — | — | 137.3 | 214.3 | 31 | 0.2 |
| | C-2 | CaO:0.5% | — | — | 124.6 | 188.5 | 27 | 0.4 |
| | C-3 | BaO:0.1% | — | — | 113.5 | 160.3 | 26 | 0.3 |
| | C-4 | CaCO$_3$:0.05% | — | — | 104.1 | 150.8 | 24 | 0.4 |
| | C-5 | BaCO$_3$:0.01% | — | — | 81.4 | 127.4 | 19 | 0.7 |
| | C-6 | Al$_2$O$_3$:0.3% CaO:0.3% | — | — | 133.6 | 205.1 | 25 | 0.2 |
| | C-7 | CaO:0.01% BaCO$_3$:0.01% | — | — | 90.0 | 137.2 | 21 | 0.4 |
| | C-8 | BaO:0.06% CaCO$_3$:0.04% | — | — | 112.6 | 160.9 | 26 | 0.4 |
| | C-9 | Al$_2$O$_3$:0.1% BaO:0.2% CaCO$_3$:0.3% | — | — | 135.0 | 206.2 | 31 | 0.3 |
| | C-10 | Al$_2$O$_3$:0.005% | — | — | 37.9 | 38.1 | — | Inward falling → Stop |
| | D-1 | Al$_2$O$_3$:0.5% BaO:0.5% | — | — | 138.4 | 270.5 | 32 | 0.1 |
| | D-2 | CaO:0.01% | — | — | 79.1 | 144.7 | 22 | 0.4 |
| | D-3 | BaCO$_3$:0.1% CaCO$_3$:0.1% | — | — | 116.9 | 197.6 | 28 | 0.3 |
| | D-4 | Al$_2$O$_3$:0.05% CaO:0.05% CaCO$_3$:0.05% | — | — | 114.8 | 192.2 | 26 | 0.4 |
| | D-5 | BaCO$_3$:0.8% | — | — | 133.1 | 250.0 | 29 | 0.3 |
| | D-6 | Al$_2$O$_3$:0.1% | — | — | 112.0 | 185.0 | 26 | 0.2 |
| | D-7 | CaO:0.35% BaCO$_3$:0.15% | — | — | 125.2 | 224.7 | 29 | 0.3 |
| | D-8 | BaO:1% | — | — | 138.2 | 272.7 | 33 | 0.1 |
| | D-9 | CaCO$_3$:0.5% | — | — | 123.2 | 227.4 | 31 | 0.1 |

As seen from the results shown in Tables 1 and 2, even when the outer diameter of the silica crucibles A-1 to A-9 and B-1 to B-9 according to the invention have a high strength capable of suppressing a crucible deformation during the pulling of the single crystal ingot by a crystalline structure formed from a an upper opening end of the crucible to a position of 40-100 when a distance from the upper opening end to a start position for the pulling of a silicon single crystal is 100 even if the outer diameter is increased to 610-810 mm for pulling a large-diameter single crystal ingot with a diameter of 200-300 mm. In addition, since no crystallization promoter is existent in the upper opening end portion of the crucible, crystallization action by the crystallization promoter is not developed, so that an amorphous structure is maintained in the inner surface of the crucible substantially contacting with a silicon melt during the pulling of the single crystal ingot, while the number of pinhole defects generated in the single crystal ingot is considerably reduced by the wavy inner surface shape with mountain parts and valley parts formed from the start line for ingot pulling to the end line for pulling in the silicon melt surface at the inner surface of the crucible with the amorphous structure. On the other hand, the conventional silica crucibles C-1 to C-9 and D-1 to D-9 have a high strength capable of suppressing the crucible deformation during the pulling of the single crystal ingot since the upper opening end portion of the crucible is a crystalline structure, but since the crystallization promoter is existent in the upper opening end portion of the crucible, crystallization is developed toward the inside of the crucible beyond the start line for ingot pulling in the silicon melt surface not only in the melt-molding of the crucible but also in the pulling of the single crystal ingot due to action thereof, and hence the presence of a zone of the crystalline structure contacting with the silicon melt is unavoidable. In this zone is more activated the generation of SiO gas at the grain boundary as described above, so that pinhole defects occur more easily in the single crystal ingot together with a fact that the wavy inner surface shape is not formed in the inner surface of the crucible. Moreover, the crucible C-10 having a small ratio of the crystalline structure at the upper opening end portion of the crucible does not have sufficient strength, so that the deformation amount of the crucible is large and the inward falling is caused at the upper portion of the crucible on the way of the pulling, resulting in the stop of pulling.

As mentioned above, the silica crucible of the invention is particularly suitable for pulling a large-diameter single crystal ingot with a diameter of 200-300 mm, and greatly contributes to the to improvement of yield and quality of a large-diameter silicon single crystal wafer.

The invention claimed is:

1. A silica crucible for pulling a silicon single crystal, comprising silica glass and having a two-layer structure of an outer layer and an inner layer,
wherein when a height position of the bottom of the crucible is 0 and a height position of the upper opening end of the crucible is 100 in a sectional side view of the crucible, the start position for the pulling of the silicon single crystal is within a height position range of 50 to 95 from the bottom of the crucible and the end position for the pulling of the silicon single crystal is within a height position range of 0 to 10 from the bottom of the crucible,
wherein the inner layer, in a sectional side view of the crucible, has a wavy inner surface shape having mountain parts and valley parts at least between the start position and the end position for the pulling of a silicon single crystal in a silicon melt surface,
the wavy inner surface shape is formed of an amorphous structure, and
when a distance from an upper opening end of the crucible to the start position for the pulling of the silicon single crystal is 100, only a crucible portion from the upper opening end to a position within a range of 40 to 100 is crystalline, and
wherein the crucible portion from the upper opening end to the position within the range of 40 to 100 does not have a crystallization promoter.

2. A silica crucible for pulling a silicon single crystal according to claim 1, wherein the inner layer has such an inner surface shape that a distance between a top position of the mountain part and a deepest position of the valley part is 0.1 to 3 mm and a distance between tops of the mountain parts is 10 to 100 mm.

3. A method of producing a silica crucible for pulling a silicon single crystal according to claim 2, wherein a crystalline structure of a crystalline portion of the crucible is formed by melt-molding the silica crucible at a state provided with a ring-shaped cutoff portion containing 0.01-1 mass % of a crystallization promoter and extending upward from an upper opening end of the crucible.

4. A method of producing a silica crucible for pulling a silicon single crystal according to claim 1, wherein a crystalline structure of a crystalline portion of the crucible is formed by melt-molding the silica crucible at a state provided with a ring-shaped cutoff portion containing 0.01-1 mass % of a crystallization promoter and extending upward from an upper opening end of the crucible.

5. A method of producing a silica crucible for pulling a silicon single crystal according to claim 4, wherein the crystallization promoter is at least one of aluminum oxide, calcium oxide, barium oxide, calcium carbonate and barium carbonate.

* * * * *